Feb. 2, 1971 C. E. ABBOTT ET AL 3,560,351

METHOD OF MAKING A THERMOELECTRIC DEVICE

Filed Aug. 24, 1967 2 Sheets-Sheet 1

INVENTORS:
COLIN E. ABBOTT
BINGLEY J. WRAY

By- Hood, Gust and Irish,
Attorneys.

METHOD OF MAKING A THERMOELECTRIC DEVICE

Filed Aug. 24, 1967 2 Sheets-Sheet 2

INVENTORS.
COLIN E. ABBOTT
BINGLEY J. WRAY
By- Hood, Gust and Irish,
Attorneys.

3,560,351

METHOD OF MAKING A THERMOELECTRIC DEVICE

Colin E. Abbott, Windsor, and Bingley J. Wray, Woodley, near Reading, England, assignors to Mining & Chemical Products Limited, London, England, a British company Filed Aug. 24, 1967, Ser. No. 663,157
Claims priority, application Great Britain, Sept. 2, 1966, 39,225/66
Int. Cl. C23b 5/48, 7/00
U.S. Cl. 204—15 4 Claims

ABSTRACT OF THE DISCLOSURE

To both major faces of a flat matrix of thermoelements electroplating resist material is applied in a grid-like pattern. The matrix with the resist on its faces is then put in an electroplating bath and constitutes the cathode therein. Metallic electrical connecting links are then formed on the thermoelements by electrodeposition. The commutation of the deposited links is determined by the pattern of the resist material. The commutations of the two faces are different.

BACKGROUND OF THE INVENTION

Field of the invention

This invention relates to an improved thermoelectric device of the type having two or more pairs of thermoelements, each pair having one "p" type thermoelement, and one "n" type thermoelement which pair constitutes a thermocouple. In a device of this type the thermoelements are electrically insulated from one another, and further the thermoelements of each pair are connected together by an electrical connection and adjacent pairs are connected together by electrical connections. Such devices operate using the Peltier effect for cooling or the Seebeck effect for generating an electric current.

DESCRIPTION OF THE PRIOR ART

Thermoelectric devices of the type referred to are known, for instance for specialised cooling applications, using the Peltier effect. It is usual to make such devices by forming a matrix, block or module of small cubes or cuboids of "n" and "p" thermoelements insulated from one another by a bonding insulating material or by air, and having electrical connections in the form of small metallic links or bridges soldered onto the faces of the thermoelements. The soldering technique is not very conducive to rapid production and in particular the heat at the faces of the thermoelements produced by soldering can cause diffusion of the connecting metal (usually copper) into the semiconductor material of the thermoelements. Such diffusion in effect "poisons" the material and can reduce its effectiveness considerably. Further, present manufacturing techniques are such as to provide relatively large spaces between the thermoelements and the heat loss across the device via the insulating medium filling these spaces may be large. In a device in accordance with the present invention soldering is not used, and the spaces between the thermoelements are not more than 0.5 mm.

SUMMARY OF THE INVENTION

In a thermoelectric device which operates using the Peltier effect or the Seebeck effect it is a desirable feature to keep heat flow across the device via the insulation between the thermoelements as low as possible, for example below 5% of the total heat conducted across the device by thermoelectric action, and preferably below 2%. Another desirable feature is to keep the overall size of a device small in relation to its performance.

Most known thermoelectric refrigerating devices operate at a relatively high current, say 10 to 20 amperes, and it is a desirable feature of such a device to reduce the current requirement. Likewise most thermoelectric generator devices have a low output voltage and it is a desirable feature of such a device to increase the voltage output. It is among the objects of this invention to provide devices having these desirable features.

In this specification "good electrical conductor" means a conductor having a resistivity of less than 10.0 microohms-cm. at room temperature. "High thermal conductivity" means a conductivity of not less than 0.1 calory per cm. per second per ° C. "Low contact resistance" means a contact resistivity of the order of $10^{-5}$ ohms-cm.$^2$, as discussed in "Thermoelectric Materials and Devices" by Cadoff and Miller, published by Reinhold Publishing Corporation, and in "Semiconductor Thermoelements and Thermoelectric Cooling" by Ioffe, published by Infosearch Ltd.

In our copending application Ser. No. 357,225, now abandoned, we disclosed a method of making thermoelectric devices of the type referred to above, in which the electrical connections were formed by depositing on an assembly of thermoelements and their separating insulation a layer of metal and by then etching the deposited metal to a desired commutation to provide metal links.

We have now devised an improved method of making a thermoelectric device, and according to this a method of making a thermoelectric device of the type referred to, comprises:

Forming an assembly of pairs of thermoelements, the assembly having two major faces;

Applying a pattern of electroplating resist material to each major face;

Placing the assembly with the resist material thereon in an electroplating bath; and Forming metallic electrical connecting links on the major faces by electrodeposition so that the commutation of the links on each major face corresponds to the pattern of resist material on that face.

The method preferably comprises the steps of: preparing a number of pieces of "n" and "p" type material; forming a matrix by fixing the pieces together by means of an insulating bonding medium, with "n" and "p" type pieces alternating; applying to the two opposed major faces of the matrix a grid-like pattern of an electroplating resist material, the apertures of the grid corresponding to a desired commutation of electrical connecting metal links; and forming the electrical connections by plating the matrix in the said apertures with a metal which is a good electrical conductor and of high thermal conductivity.

Preferably the plated metal on each face is ground or lapped to flatness, to parallelism with the other face, and approximately to parallelism with the major faces of the matrix.

BRIEF DESCRIPTION OF THE DRAWINGS

A thermoelectric device in accordance with the invention, and the preferred method of making it, will now be described in more detail by way of example, with reference to the accompanying drawings, in which.

DESCRIPTION OF THE PREFERRED EMBODIMENT

A matrix is first made as described in our copending application Ser. No. 357,225 particularly with reference to the numbered steps 1 to 10 in that specification.

Figure 1:
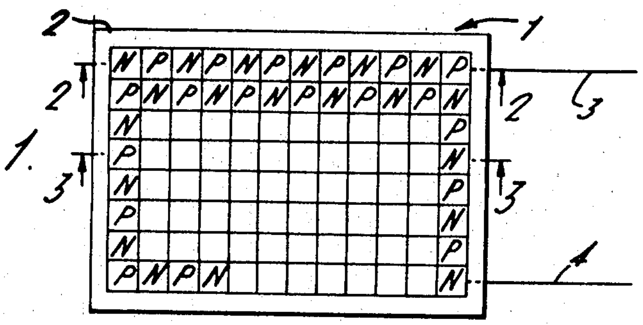
FIG. 1 is a plan of one major face of a matrix of "n" type and "p" type thermoelements; the other, opposed major face is the same.
Figure 2:
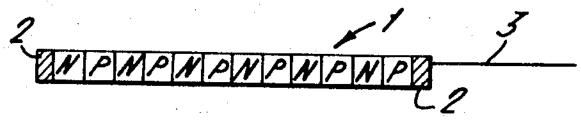
FIGS. 2 and 3 are diagrammatic sections on planes 2—2 and 3—3 indicated in FIG. 1.
Figure 3:
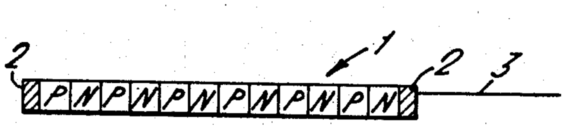

Referring to FIG. 1 of the accompanying drawings a matrix 1 comprises 96 semiconductor thermoelements forming 48 pairs of thermoelements, in 8 horizontal rows of 16 pairs each. Some of the "n" and "p" indications are shown. The thermoelements and the pairs are separated by insulating bonding material which is represented by the lines between the thermoelements. The matrix 1 is completed by a frame 2 of rigid, insulating plastics material, to form an assembly of pairs of thermoelements. FIGS. 2 and 3 indicate the alternate disposition of the pairs of thermoelements in the horizontal rows indicated by the section planes 2—2 and 3—3 in FIG. 1.

FIG. 1 shows the first major face; the other or second, opposed major face is the same. Also shown are electrical supply leads 3 and 4.

Figure 4:
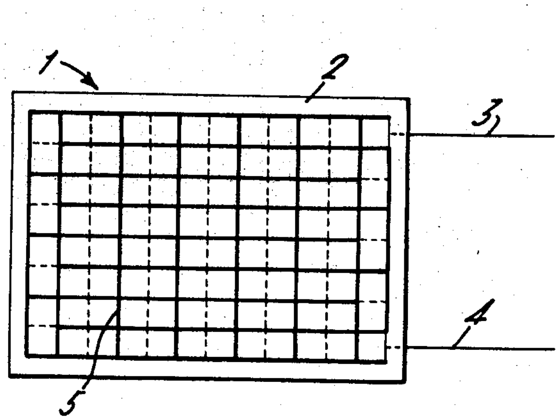
FIG. 4 is a plan of the major face of FIG. 1 with a grid-like pattern of electroplating resist applied to it.
Figure 5:
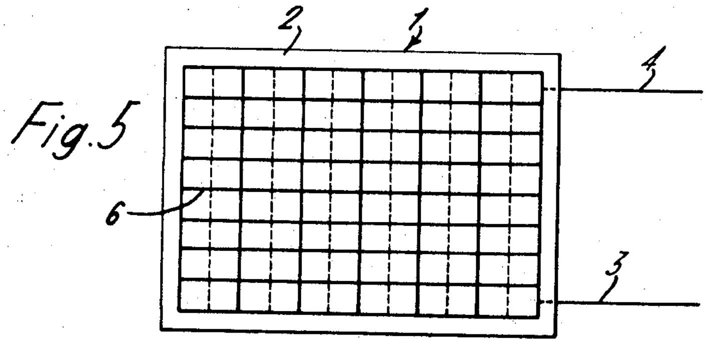
FIG. 5 is a plan of the other, opposed major face with a grid-like pattern of electroplating resist applied to it.

Referring to FIG. 4, the first major face is shown with a first grid-like pattern 5 of electroplating resist material applied to it. FIG. 5 shows the second grid-like pattern 6 of electroplating resist material applied to the second, opposed major face. It will be seen that the patterns are different, in that each defines a different series of apertures. These two different series of apertures correspond to the desired commutation of the electrical connecting links on the two faces, as will be explained below.

Various plating resist materials can be used. It is preferred to use an ink which is printed on to the matrix to the required grid-like pattern 5 or 6 by silk-screen printing. This kind of printing is conventional and need not be described further. The ink is a two or three-component resin system which, when printed, can be dried or cured to a hard, well-defined and adherent deposit. The width of the printed lines is of the order of 0.015 inch and the thickness is of the order of 0.002 or 0.003 inch.

As will be seen by comparing FIGS. 4 and 5 with FIG. 1, the lines of plating resist material are printed on top of some, but not all, of the lines of insulating bonding material.

Other possible plating resist materials are: photosensitive resist materials; conventional plating "stop-off" lacquers; and ceramic paints.

The leads 3 and 4 are connected respectively to the top right-hand "p" type and bottom right-hand "n" type thermoelements, as indicated by the dotted lines shown. These leads have two functions: used in parallel for supply of plating current to the matrix, in which event the leads are joined; or used in series to form circuit connections for the finished thermoelectric device, in which event the leads are separate.

Figure 6:
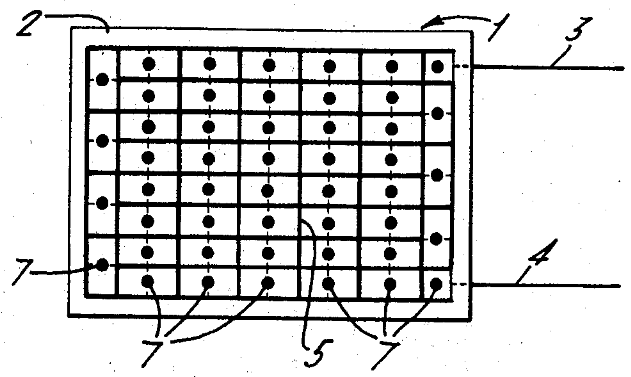
FIG. 6 is similar to FIG. 4 but showing the application of conducting bridges.

After the grid-like patterns have been printed on, the next step (FIG. 6) is to form metallic conducting bridges 7 over those lines of insulating bonding material which have not been covered by the plating resist material. FIG. 6 shows the disposition of the bridges 7 for the first major face. The disposition of the bridges for the second major face would differ slightly, as will be readily understood by comparing FIGS. 4 and 6 with FIG. 5. Various methods of forming the bridges 7 may be used. One such method is to print the bridges 7 on to the major faces in the form of small dots of an air-drying silver suspension. The bridges 7 would thus be formed of silver dots.

When these bridges 7 are formed on both major faces, a circuit is formed from lead 3, through the 96 thermoelements, to the lead 4. Although this circuit is of relatively high resistance (of the order of 50–500 ohms) compared with the resistance of the finished device (of the order of 1 ohm), nevertheless the circuit is such that the matrix can form the cathode in a plating bath.

Figure 7:
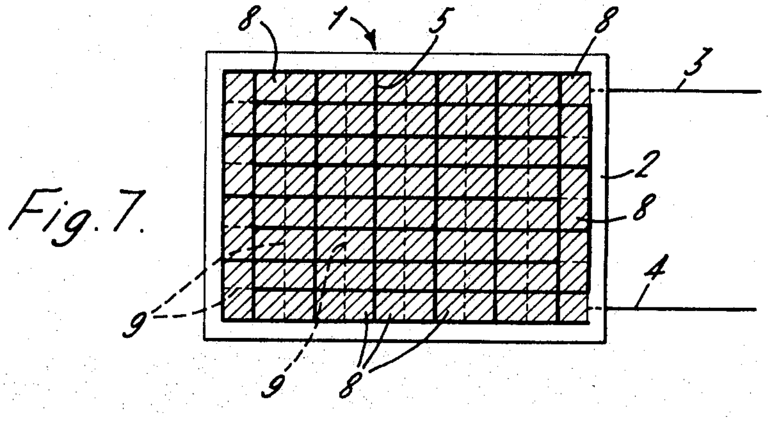
FIG. 7 is similar to FIG. 6 but illustrating a preliminary plating step.

In the next step therefore, the leads 3 and 4 are joined together and connected to the supply in a nickel plating bath so that the matrix forms the cathode. In this bath nickel links 8 (FIG. 7) are deposited on both major faces to a depth of the order of 0.0001 to 0.0005 inch. As seen in FIG. 7, the nickel links 8 are deposited in the apertures of the grid-like pattern. (In FIG. 7, the positions of lines of insulating bonding material are indicated by the dotted lines 9.)

The next step is similar, except that it takes place in a copper plating bath, so that copper links 10 (FIG. 8) to a depth of the order of 0.005 inch are deposited over the nickel links.

The final step is to grind or lap the plated copper links to make the two major faces flat and parallel to one another, and substantially parallel to the major faces of the matrix.

As was mentioned above, the two grid-like patterns 5 and 6 are different so as to produce the desired commutations of the copper connecting links 10 on the two major faces. This will now be explained with reference to FIG. 1 and FIG. 9, which is a diagrammatic section on the plane 9—9 of FIG. 8.

Figure 8:
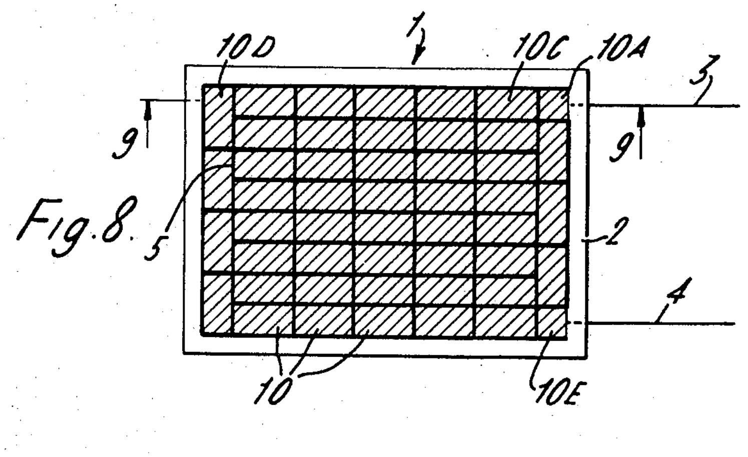
FIG. 8 is similar to FIG. 7 but illustrating the final plating step.
Figure 9:
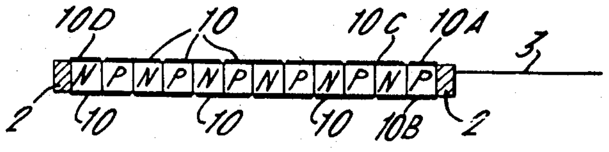
FIG. 9 is a diagrammatic section on the plane 9—9 of FIG. 8.

In FIG. 9 the first major face is the top face, which is seen in plan in FIG. 8, whilst the second major face is the under face. The deposition of the copper links 10 of the top horizontal row of thermoelements is shown, (i.e. "top" as seen in FIGS. 1 and 8). The circuit is through lead 3 (now separated from lead 4) to the right hand "p" type thermoelement (below link 10A) to the link 10B, through link 10B to the adjacent "n" type thermoelement, up through the latter to the link 10C and so on to the link 10D, which (see FIG. 8) carries the circuit to the left-hand end of the next horizontal row below the top row. This procedure continues until the last link 10E (FIG. 8) is reached, and then through lead 4.

What we claim is:

1. A method of making a thermoelectric device of the type referred to, comprising:

forming an assembly of pairs of thermoelements, the assembly having two major faces;

applying a grid of crossed lines of electroplating resist material to each major face in a pattern wherein the apertures in the grid correspond to the desired commutation;

connecting the thermoelements of each pair and connecting adjacent pairs of thermoelements to form a continuous electrical path by applying discrete conducting bridges on both major faces at each point where a permanent connecting link is to be formed; and placing the assembly with the resist material thereon in an electroplating bath and forming metallic electrical connecting links on the major faces by electrodeposition so that the commutation of the links on each major face corresponds to the grid of resist material on that face.

2. A method according to claim 1 wherein the silver is applied by printing of an air-drying silver suspension.

3. A method according to claim 1 wherein the links are formed in two steps, first by the electrodeposition of nickel onto the thermoelements and then by the deposition of copper onto the deposited nickel.

4. A method according to claim 1 wherein, after the bridges have been formed, input and output leads of the assembly are connected together, the assembly being then placed in the bath, and the connected leads being connected to a source of supply so that the assembly constitutes the cathode in the bath.

References Cited

UNITED STATES PATENTS

| | | | |
|---|---|---|---|
| 2,834,723 | 5/1958 | Robinson | 204—15 |
| 3,296,034 | 1/1967 | Reich | 204—15 |
| 3,300,840 | 1/1967 | Marshall et al. | 204—15 |

FOREIGN PATENTS

| | | | |
|---|---|---|---|
| 587,490 | 4/1947 | Great Britain | 204—15 |

OTHER REFERENCES

Harold Shapiro: Plating, June 1957, pp. 607–611.

JOHN H. MACK, Primary Examiner

T. TUFARIELLO, Assistant Examiner

U.S. Cl. X.R.

204—16